United States Patent
Peng et al.

(10) Patent No.: US 10,868,421 B2
(45) Date of Patent: Dec. 15, 2020

(54) ON-CHIP MULTIPLE-STAGE ELECTRICAL OVERSTRESS (EOS) PROTECTION DEVICE

(71) Applicant: AMAZING MICROELECTRONIC CORP., New Taipei (TW)

(72) Inventors: James Jeng-Jie Peng, Taoyuan County (TW); Woei-Lin Wu, Zhubei (TW); Ryan Hsin-Chin Jiang, Taipei (TW)

(73) Assignee: Amazing Microelectronic Corp., New Taipei (TW)

(*) Notice: Subject to any disclaimer, the term of this patent is extended or adjusted under 35 U.S.C. 154(b) by 412 days.

(21) Appl. No.: 16/027,721

(22) Filed: Jul. 5, 2018

(65) Prior Publication Data

US 2020/0014200 A1  Jan. 9, 2020

(51) Int. Cl.
| | |
|---|---|
| *H02H 9/04* | (2006.01) |
| *H01L 23/522* | (2006.01) |
| *H01L 23/528* | (2006.01) |
| *H01L 23/60* | (2006.01) |
| *H01L 23/62* | (2006.01) |

(Continued)

(52) U.S. Cl.
CPC .......... *H02H 9/046* (2013.01); *H01L 23/528* (2013.01); *H01L 23/5226* (2013.01); *H01L 23/5227* (2013.01); *H01L 23/5228* (2013.01); *H01L 23/60* (2013.01); *H01L 23/62* (2013.01); *H01L 27/0255* (2013.01); *H01L 27/0288* (2013.01); *H01L 27/0292* (2013.01); *H01L 28/10* (2013.01); *H01L 28/20* (2013.01)

(58) Field of Classification Search
CPC . H02H 9/046; H01L 23/5226; H01L 23/5227; H01L 23/5228; H01L 23/528; H01L 23/60; H01L 23/62; H01L 27/0255; H01L 27/0288; H01L 27/0292; H01L 28/10; H01L 28/20

USPC .......................................................... 361/56
See application file for complete search history.

(56) References Cited

U.S. PATENT DOCUMENTS

| | | | |
|---|---|---|---|
| 5,521,783 A | 5/1996 | Wolfe et al. | |
| 2007/0216015 A1* | 9/2007 | Schnitt | H01L 27/0248 257/692 |

FOREIGN PATENT DOCUMENTS

| | | |
|---|---|---|
| CN | 104377677 A | 2/2015 |
| CN | 205791590 U | 12/2016 |

(Continued)

OTHER PUBLICATIONS

Search Report Issued by a Foreign Patent Office for Foreign Patent Application No. 201810897898.5.

*Primary Examiner* — Kevin J Comber
(74) *Attorney, Agent, or Firm* — Rosenberg, Klein & Lee

(57) ABSTRACT

An on-chip multiple-stage electrical overstress (EOS) protection device is disclosed. The protection device includes a surge protector having a first clamping voltage and a first electrostatic discharge (ESD) protector having a second clamping voltage lower than the first clamping voltage. The surge protector is electrically connected to the first ESD protector in parallel. The surge protector and the first ESD protector are electrically connected between a receiving terminal and a voltage terminal, and the receiving terminal is electrically connected to an internal circuit. When an electrical overstress (EOS) signal including an electrostatic discharge (ESD) signal and a surge signal appears at the receiving terminal, the first ESD protector and the surge protector are triggered on in turn to clamp a voltage received by the internal circuit.

20 Claims, 14 Drawing Sheets

(51) Int. Cl.
*H01L 27/02* (2006.01)
*H01L 49/02* (2006.01)

(56) References Cited

FOREIGN PATENT DOCUMENTS

| TW | I273693 B | 2/2007 |
| TW | I337833 B | 2/2011 |
| TW | 201228171 A | 7/2012 |

\* cited by examiner

ON-CHIP MULTIPLE-STAGE ELECTRICAL OVERSTRESS (EOS) PROTECTION DEVICE

BACKGROUND OF THE INVENTION

Field of the Invention

The present invention relates to a protection device, particularly to an on-chip multiple-stage electrical overstress (EOS) protection device.

Description of the Related Art

Among possible abnormal electronic events occurred in chip I/O interfaces, ESD (Electro-Static Discharge) happens when accumulated electro-static charges are suddenly conducted to conductive structures of the I/O interfaces (e.g., pad/pins/solder balls). ESD can be modeled as a charge source which can build a rapid high voltage pulse (with a duration of one to several nanoseconds) on conductive structures by accumulated electro-static charges; however, if its charges can be quickly routed outside the chips as current, the charge source dissipates, and its impact of high voltage is minimized or prevented. Therefore, an ESD protection device is used to provide a current path routing current charges of ESD while ESD is detected.
In addition to aforementioned ESD, another kind of abnormal electronic events known as surge draws much attention in recent years. Compared to rapid high voltage due to charge accumulation of ESD, surge can be modeled as a voltage source sustaining longer (in an order of $1\times10^{-5}$ seconds). The energy ratio of surge to ESD is 1000. Refer to FIG. 1, if an ESD protection device 10 in a chip connects with an internal circuit 12 coupled to a high-voltage terminal VDD and a low-voltage terminal VSS and conducts a current path during surge, exceeding current will sustain to flow through the current path and then jeopardize the ESD protection device 10. When the ESD protection device 10 is replaced with a surge protector, the ESD signal does not awake the surge protector. In other words, the surge protector does not bypass the ESD signal.

To overcome the abovementioned problems, the present invention provides an on-chip multiple-stage electrical overstress (EOS) protection device, so as to solve the aforementioned problems of the prior art.

SUMMARY OF THE INVENTION

A primary objective of the present invention is to provide an on-chip multiple-stage electrical overstress (EOS) protection device, which uses surge and electrostatic discharge (ESD) protectors to protect an internal circuit from a surge event or an ESD event.

To achieve the abovementioned objectives, the present invention provides an on-chip multiple-stage EOS protection device, which comprises a surge protector having a first clamping voltage and a first electrostatic discharge (ESD) protector having a second clamping voltage lower than the first clamping voltage. The surge protector is electrically connected to the first ESD protector in parallel. The surge protector and the first ESD protector are electrically connected between a receiving terminal and a voltage terminal, and the receiving terminal is electrically connected to an internal circuit. When an electrical overstress (EOS) signal including an electrostatic discharge (ESD) signal and a surge signal appears at the receiving terminal, the first ESD protector and the surge protector are triggered on in turn to clamp a voltage received by the internal circuit.

In an embodiment of the present invention, the receiving terminal is an input/output (I/O) port, the voltage terminal is a low-voltage terminal, and the internal circuit is electrically connected to the low-voltage terminal and a high-voltage terminal.

In an embodiment of the present invention, the receiving terminal is a high-voltage terminal and the voltage terminal is a low-voltage terminal, and the internal circuit is electrically connected to the low-voltage terminal.

In an embodiment of the present invention, the surge protector is a conductive-tip discharging device.

In an embodiment of the present invention, the first ESD protector is formed in a semiconductor substrate, a conductive wiring layer is formed on the semiconductor substrate and electrically connected to the first ESD protector, the conductive-tip discharging device further comprises at least one first conductive block and at least one second conductive block, the at least one first conductive block separates from the at least one second conductive block, the at least one first conductive block and the at least one second conductive block are formed on and electrically connected to the conductive wiring layer, a dielectric structure is formed on the conductive wiring layer and between the at least one first conductive block and the at least one second conductive block, the at least one first conductive block and the at least one second conductive block are respectively electrically connected to the receiving terminal and the voltage terminal, and the at least one first conductive block is electrically connected to the internal circuit.

In an embodiment of the present invention, the on-chip multiple-stage EOS protection device further comprises a first electrostatic discharge (ESD) enhancer electrically connected between the surge protector and the first ESD protector and electrically connected between the receiving terminal and the internal circuit to block the surge signal, and when the EOS signal appears at the receiving terminal, the first ESD protector and the surge protector are triggered on in turn by a voltage drop of the first ESD enhancer.

In an embodiment of the present invention, the first ESD enhancer is a resistive block formed between the conductive wiring layer and the semiconductor substrate, and the conductive wiring layer further comprises a dielectric layer formed on the semiconductor substrate to cover the resistive block and provided with the at least one first conductive block, the at least one second conductive block, and the dielectric structure thereon; at least one third conductive block embedded in the dielectric layer and electrically connected to the internal circuit; at least one fourth conductive block embedded in the dielectric layer, separating from the at least one third conductive block, and electrically connected to the voltage terminal; a first conductive via formed in the dielectric layer to electrically connect the first ESD protector with the at least one third conductive block; a second conductive via formed in the dielectric layer to electrically connect the first ESD protector with the at least one fourth conductive block; a third conductive via formed in the dielectric layer to electrically connect the at least one third conductive block with the resistive block; a fourth conductive via formed in the dielectric layer to electrically connect the resistive block with the at least one first conductive block, and the at least one first conductive block is electrically connected to the receiving terminal; and a fifth conductive via formed in the dielectric layer to electrically connect the at least one fourth conductive block with the at least one second conductive block.

In an embodiment of the present invention, the resistive block comprises high resistive polysilicon.

In an embodiment of the present invention, the first ESD enhancer is an inductive block embedded in the conductive wiring layer, and the conductive wiring layer further comprises a dielectric layer formed on the semiconductor substrate and provided with the at least one first conductive block, the at least one second conductive block, and the dielectric structure thereon, and the inductive block is embedded in the dielectric layer; at least one third conductive block embedded in the dielectric layer and electrically connected to the inductive block and the internal circuit; at least one fourth conductive block embedded in the dielectric layer, separating from the at least one third conductive block, and electrically connected to the voltage terminal; a first conductive via formed in the dielectric layer to electrically connect the first ESD protector with the at least one third conductive block; a second conductive via formed in the dielectric layer to electrically connect the first ESD protector with the at least one fourth conductive block; a third conductive via formed in the dielectric layer to electrically connect the inductive block with the at least one first conductive block, and the at least one first conductive block is electrically connected to the receiving terminal; and a fourth conductive via formed in the dielectric layer to electrically connect the at least one fourth conductive block with the at least one second conductive block.

In an embodiment of the present invention, the inductive block is an inductive coil.

In an embodiment of the present invention, the on-chip multiple-stage EOS protection device further comprises a plurality of second electrostatic discharge (ESD) protectors having different third clamping voltages lower than the second clamping voltage, electrically connected in parallel, and electrically connected between the internal circuit and the voltage terminal; and a plurality of second electrostatic discharge (ESD) enhancers electrically connected between the first ESD enhancer and the internal circuit to block the surge signal, one of the plurality of second ESD enhancers is electrically connected between two of the plurality of second ESD protectors, one of the plurality of second ESD enhancers is electrically connected between the first ESD enhancer and one of the plurality of second ESD enhancers, when the EOS signal appears at the receiving terminal, the plurality of second ESD protectors are sequentially triggered on according to an order of from the lowest third clamping voltage to the highest third clamping voltage by voltage drops of the plurality of second ESD enhancers, and after the plurality of second ESD protectors are triggered on, the first ESD protector is triggered on.

In an embodiment of the present invention, the surge protector and the first ESD protector, the plurality of second ESD protectors, the first ESD enhancer, and the plurality of second ESD enhancers are integrated in a chip.

In an embodiment of the present invention, the first ESD enhancer is a forward diode, a diode-string, a resistor, a resistor-string, an inductor, an inductor-string, a capacitor, a capacitor-string, a single-stage resistor-capacitor (RC) network shunted to ground, a single-stage inductor-capacitor (LC) network shunted to ground, a multiple-stage resistor-capacitor (RC) network shunted to ground, or a multiple-stage inductor-capacitor (LC) network shunted to ground, and each of the plurality of second ESD enhancer is a forward diode, a diode-string, a resistor, a resistor-string, an inductor, an inductor-string, a capacitor, a capacitor-string, a single-stage resistor-capacitor (RC) network shunted to ground, a single-stage inductor-capacitor (LC) network shunted to ground, a multiple-stage resistor-capacitor (RC) network shunted to ground, or a multiple-stage inductor-capacitor (LC) network shunted to ground.

In an embodiment of the present invention, each of the plurality of second ESD protectors is a diode, a diode-string, a Zener diode, a Zener diode-string, a metal-oxide-semiconductor field effect transistor (MOSFET), a cascaded metal-oxide-semiconductor field effect transistor (MOSFET)-string, a bipolar junction transistor (BJT), or a cascoded bipolar junction transistor (BJT)-string.

In an embodiment of the present invention, the on-chip multiple-stage EOS protection device further comprises a first electrostatic discharge (ESD) enhancer electrically connected between the receiving terminal and the first ESD protector, and when the EOS signal appears at the receiving terminal, the first ESD protector and the surge protector are triggered on in turn by a voltage drop of the first ESD enhancer.

In an embodiment of the present invention, the on-chip multiple-stage EOS protection device further comprises a plurality of second electrostatic discharge (ESD) protectors having different third clamping voltages lower than the second clamping voltage, electrically connected in parallel, and electrically connected between the internal circuit and the voltage terminal; and a plurality of second electrostatic discharge (ESD) enhancers respectively electrically connected to the plurality of second ESD protectors, each of the plurality of second ESD enhancers is electrically connected between the second ESD protector corresponded thereof and the internal circuit, when the EOS signal appears at the receiving terminal, the plurality of second ESD protectors are sequentially triggered on according to an order of from the lowest third clamping voltage to the highest third clamping voltage by voltage drops of the plurality of second ESD enhancers, and after the plurality of second ESD protectors are triggered on, the first ESD protector is triggered on.

In an embodiment of the present invention, the surge protector and the first ESD protector, the plurality of second ESD protectors, the first ESD enhancer, and the plurality of second ESD enhancers are integrated in a chip.

In an embodiment of the present invention, the first ESD enhancer is a forward diode, a diode-string, a resistor, a resistor-string, an inductor, an inductor-string, a capacitor, a capacitor-string, a single-stage resistor-capacitor (RC) network shunted to ground, a single-stage inductor-capacitor (LC) network shunted to ground, a multiple-stage resistor-capacitor (RC) network shunted to ground, or a multiple-stage inductor-capacitor (LC) network shunted to ground.

In an embodiment of the present invention, each of the plurality of second ESD protectors is a diode, a diode-string, a Zener diode, a Zener diode-string, a metal-oxide-semiconductor field effect transistor (MOSFET), a cascaded metal-oxide-semiconductor field effect transistor (MOSFET)-string, a bipolar junction transistor (BJT), or a cascoded bipolar junction transistor (BJT)-string.

In an embodiment of the present invention, the surge protector is a conductive-tip discharging device, a silicon-controlled rectifier (SCR), a cascoded SCR-string, a transient voltage suppressor (TVS), a cascoded transient voltage suppressor (TVS)-string, a metal-oxide-semiconductor field effect transistor (MOSFET), a cascoded metal-oxide-semiconductor field effect transistor (MOSFET)-string, a bipolar junction transistor (BJT), a cascoded bipolar junction transistor (BJT) string, a varistor, a cascoded varistor-string, a diode, a diode-string, a Zener diode, or a Zener diode-string.

In an embodiment of the present invention, the first ESD protector is a silicon-controlled rectifier (SCR), a cascoded silicon-controlled rectifier (SCR)-string, a transient voltage suppressor (TVS), a cascoded transient voltage suppressor (TVS)-string, a metal-oxide-semiconductor field effect transistor (MOSFET), a cascoded metal-oxide-semiconductor field effect transistor (MOSFET)-string, a bipolar junction transistor (BJT), a cascoded bipolar junction transistor (BJT) string, a varistor, a cascoded varistor-string, a diode, a diode-string, a Zener diode, or a Zener diode-string.

Below, the embodiments are described in detail in cooperation with the drawings to make easily understood the technical contents, characteristics and accomplishments of the present invention.

DETAILED DESCRIPTION OF THE INVENTION

Figure 1:
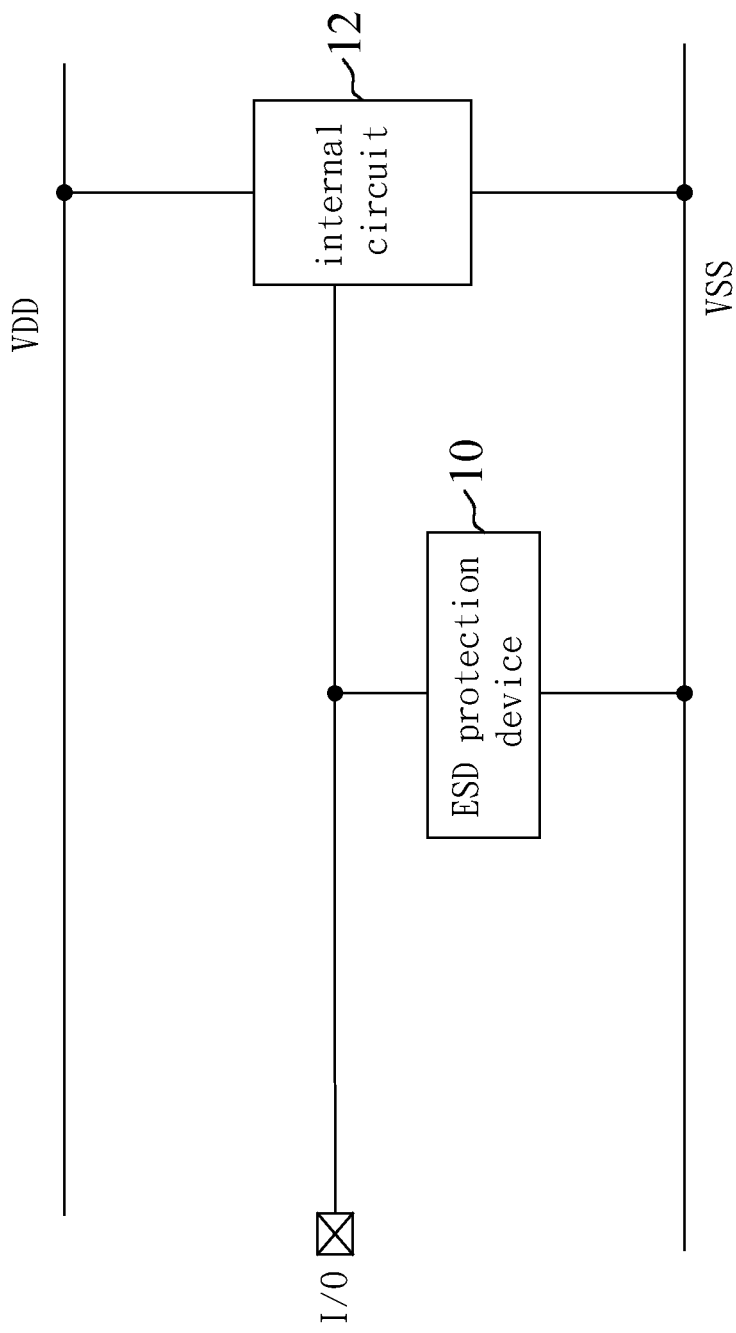
FIG. 1 is a schematic diagram illustrating a traditional electrostatic discharge (ESD) circuit connected with an internal circuit.
Figure 2:
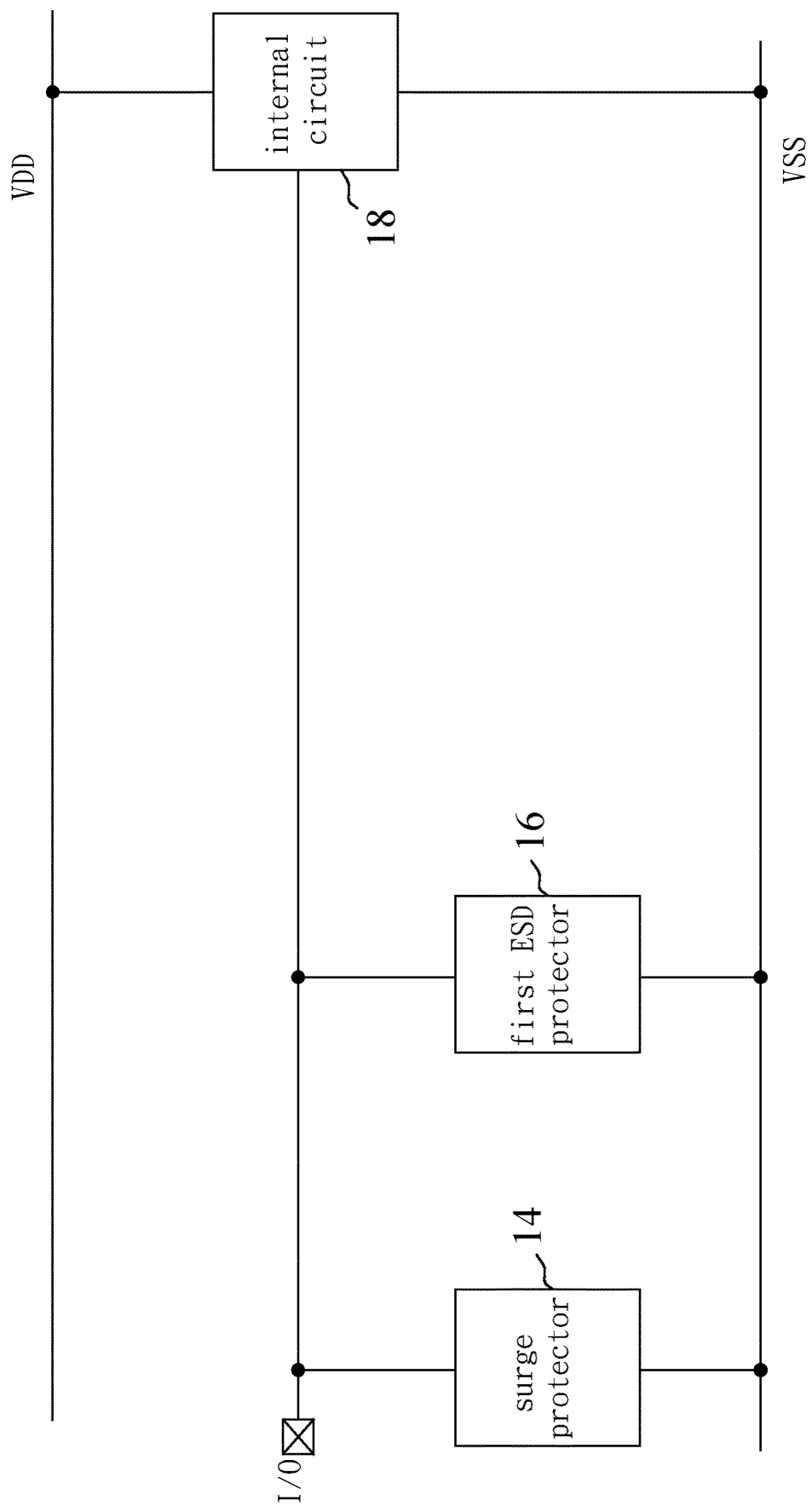
FIG. 2 is a schematic diagram illustrating an on-chip multiple-stage electrical overstress (EOS) protection device according to the first embodiment of the present invention.

Refer to FIG. 2. The first embodiment of the on-chip multiple-stage electrical overstress (EOS) protection device of the present invention is introduced as follows. The on-chip multiple-stage EOS protection device comprises a surge protector 14 having a first clamping voltage and a first electrostatic discharge (ESD) protector 16 having a second clamping voltage lower than the first clamping voltage. The surge protector 14 is electrically connected to the first ESD protector 16 in parallel. The surge protector 14 and the first ESD protector 16 are electrically connected between a receiving terminal and a voltage terminal. The receiving terminal is electrically connected to an internal circuit 18. In the first embodiment, the receiving terminal is an input/output (I/O) port, the voltage terminal is a low-voltage terminal VSS, and the internal circuit 18 is electrically connected to the low-voltage terminal and a high-voltage terminal VDD. The surge protector 14 and the first ESD protector 16 are integrated in a chip that is independent from the internal circuit 18.

When an electrical overstress (EOS) signal comprising an electrostatic discharge (ESD) signal and a surge signal appears at the receiving terminal, the first ESD protector 16 and the surge protector 14 are triggered on in turn to clamp a voltage received by the internal circuit 18, thereby protecting the internal circuit 18 from a surge event or an ESD event.

In the first embodiment, the surge protector 14 may be a conductive-tip discharging device and the first ESD protector 16 may be a silicon-controlled rectifier (SCR), a cascoded silicon-controlled rectifier (SCR)-string, a transient voltage suppressor (TVS), a cascoded transient voltage suppressor (TVS)-string, a metal-oxide-semiconductor field effect transistor (MOSFET), a cascoded metal-oxide-semiconductor field effect transistor (MOSFET)-string, a bipolar junction transistor (BJT), a cascoded bipolar junction transistor (BJT) string, a varistor, a cascoded varistor-string, a diode, a diode-string, a Zener diode, or a Zener diode-string.

Figure 3:
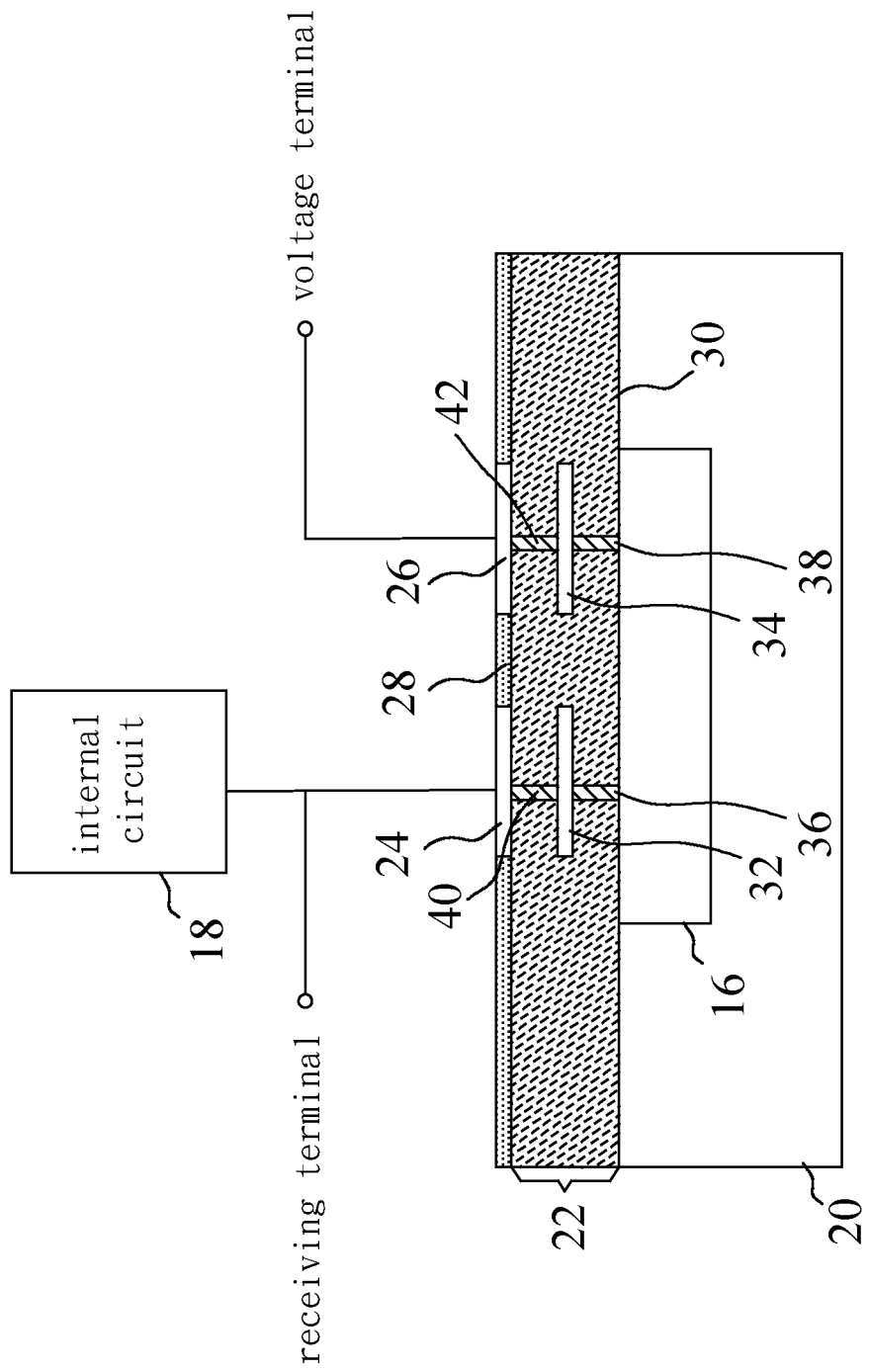
FIG. 3 is a cross-sectional view of a surge protector and a first electrostatic discharge (ESD) protector according to the first embodiment of the present invention.

Refer to FIG. 2 and FIG. 3. The first ESD protector 16 is formed in a semiconductor substrate 20, a conductive wiring layer 22 is formed on the semiconductor substrate 20 and electrically connected to the first ESD protector 16. The conductive-tip discharging device used as the surge protector 14 further comprises at least one first conductive block 24 and at least one second conductive block 26, the at least one first conductive block 24 separates from the at least one second conductive block 26, the at least one first conductive block 24 and the at least one second conductive block 26 are formed on and electrically connected to the conductive wiring layer 22, a dielectric structure 28 is formed on the conductive wiring layer 22 and between the at least one first conductive block 24 and the at least one second conductive block 26, the at least one first conductive block 24 and the at least one second conductive block 26 are respectively electrically connected to the receiving terminal and the voltage terminal, and the at least one first conductive block 24 is electrically connected to the internal circuit 18. For example, each of the first conductive block 24 and the second conductive block 26 has a shape of a trapezoid. The trapezoid has a long side and a short side. The short side of the first conductive block 24 faces to the short side of the second conductive block 26. Since the conductive-tip discharging device is formed on the semiconductor substrate 20 rather than in the semiconductor substrate 20, the conductive-tip discharging device has the best heat-dissipating properties to protect from damage and discharge a very large surge current. The conductive wiring layer 22 may be realized with various structures. For example, the conductive wiring layer 22 comprises a dielectric layer 30, at least one third conductive block 32, at least one fourth conductive block 34, a first conductive via 36, a second conductive via 38, a third conductive via 40, and a fourth conductive via 42. The dielectric layer 30 is formed on the semiconductor substrate 20 and provided with the at least one first conductive block 24, the at least one second conductive block 26, and the dielectric structure 28 thereon. The at least one third conductive block 32 and the at least one fourth conductive block 34 are embedded in the dielectric layer 30. The first conductive via 36, the second conductive via 38, the third conductive via 40, and the fourth conductive via 42 are formed in the dielectric layer 30. The first conductive via 36 electrically connects the first ESD protector 16 with the at least one third conductive block 32. The second conductive via 38 electrically connects the first ESD protector 16 with the at least one fourth conductive block 34. The third conductive via 40 electrically connects the at least one third conductive block 32 with the at least one first conductive block 24. The fourth conductive via 42 electrically connects the at least one fourth conductive block 34 with the at least one second conductive block 26.

In addition to the conductive-tip discharging device, the surge protector 14 may alternatively be a silicon-controlled rectifier (SCR), a cascoded SCR-string, a transient voltage suppressor (TVS), a cascoded transient voltage suppressor (TVS)-string, a metal-oxide-semiconductor field effect transistor (MOSFET), a cascoded metal-oxide-semiconductor field effect transistor (MOSFET)-string, a bipolar junction transistor (BJT), a cascoded bipolar junction transistor (BJT) string, a varistor, a cascoded varistor-string, a diode, a diode-string, a Zener diode, or a Zener diode-string.

Figure 4:
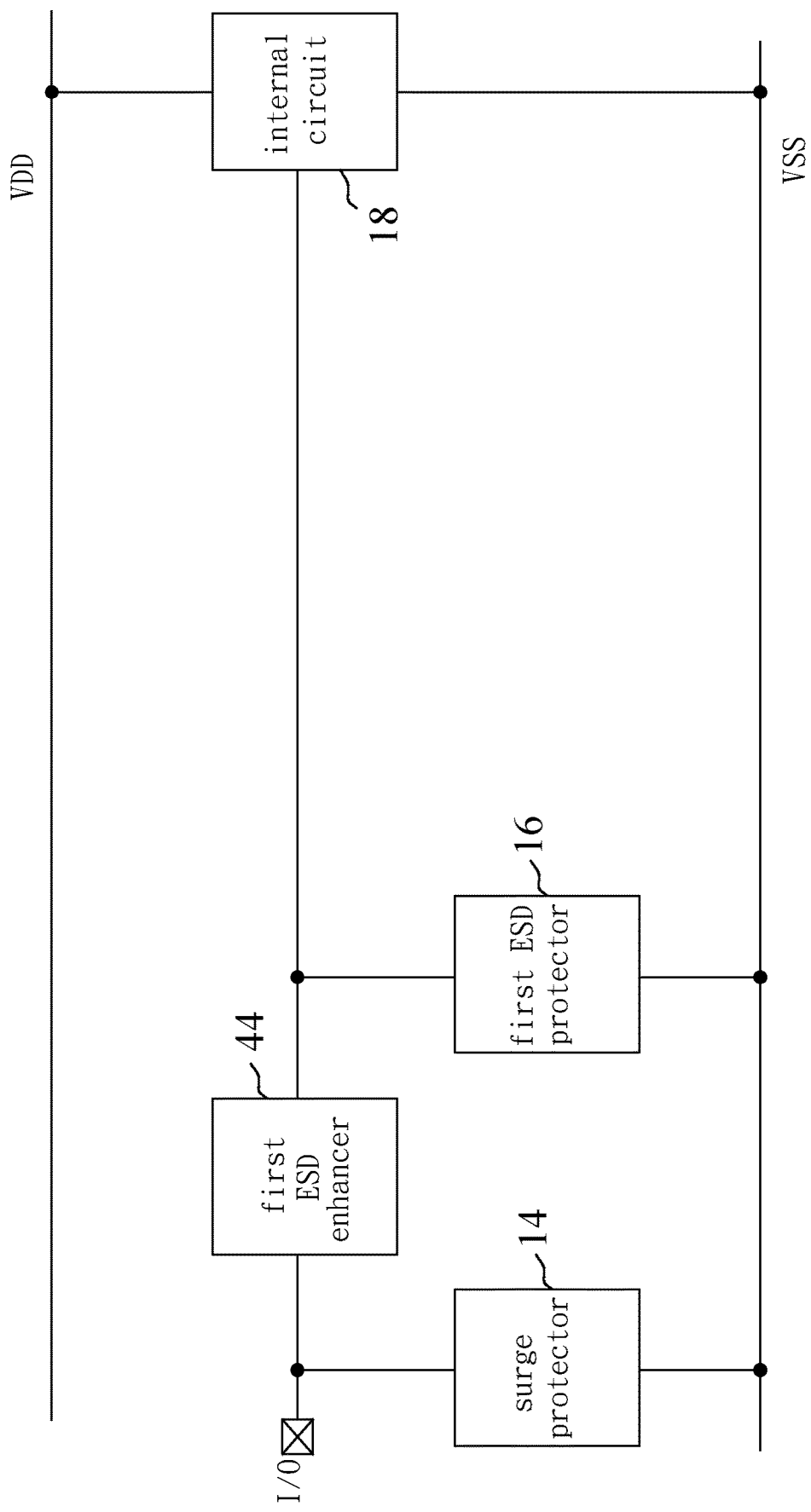
FIG. 4 is a schematic diagram illustrating an on-chip multiple-stage EOS protection device according to the second embodiment of the present invention.

Refer to FIG. 4. The second embodiment of the on-chip multiple-stage EOS protection device of the present invention is introduced as follows. The second embodiment is different from the first embodiment in that the second embodiment further comprises a first electrostatic discharge (ESD) enhancer 44 electrically connected between the surge protector 14 and the first ESD protector 16 and electrically connected between the receiving terminal and the internal circuit 18 to block the surge signal. The surge protector 14, the first ESD protector 16, and the first ESD enhancer 44 are integrated in a chip that is independent from the internal circuit 18. When the EOS signal appears at the receiving terminal, the first ESD protector 16 and the surge protector 14 are triggered on in turn by the voltage drop of the first ESD enhancer 44.

The first ESD enhancer 44 may be a forward diode, a diode-string, a resistor, a resistor-string, an inductor, an inductor-string, a capacitor, a capacitor-string, a single-stage resistor-capacitor (RC) network shunted to ground, a single-stage inductor-capacitor (LC) network shunted to ground, a multiple-stage resistor-capacitor (RC) network shunted to ground, or a multiple-stage inductor-capacitor (LC) network shunted to ground. When the first ESD enhancer 44 is a resistor, the resistor is realized a resistive block 46 shown in FIG. 5. The resistive block 46 comprises high resistive polysilicon. When the first ESD enhancer 44 is an inductor, the inductor is realized with an inductive block 48 shown in FIG. 6. The inductive block 48 is an inductive coil.

Figure 5:
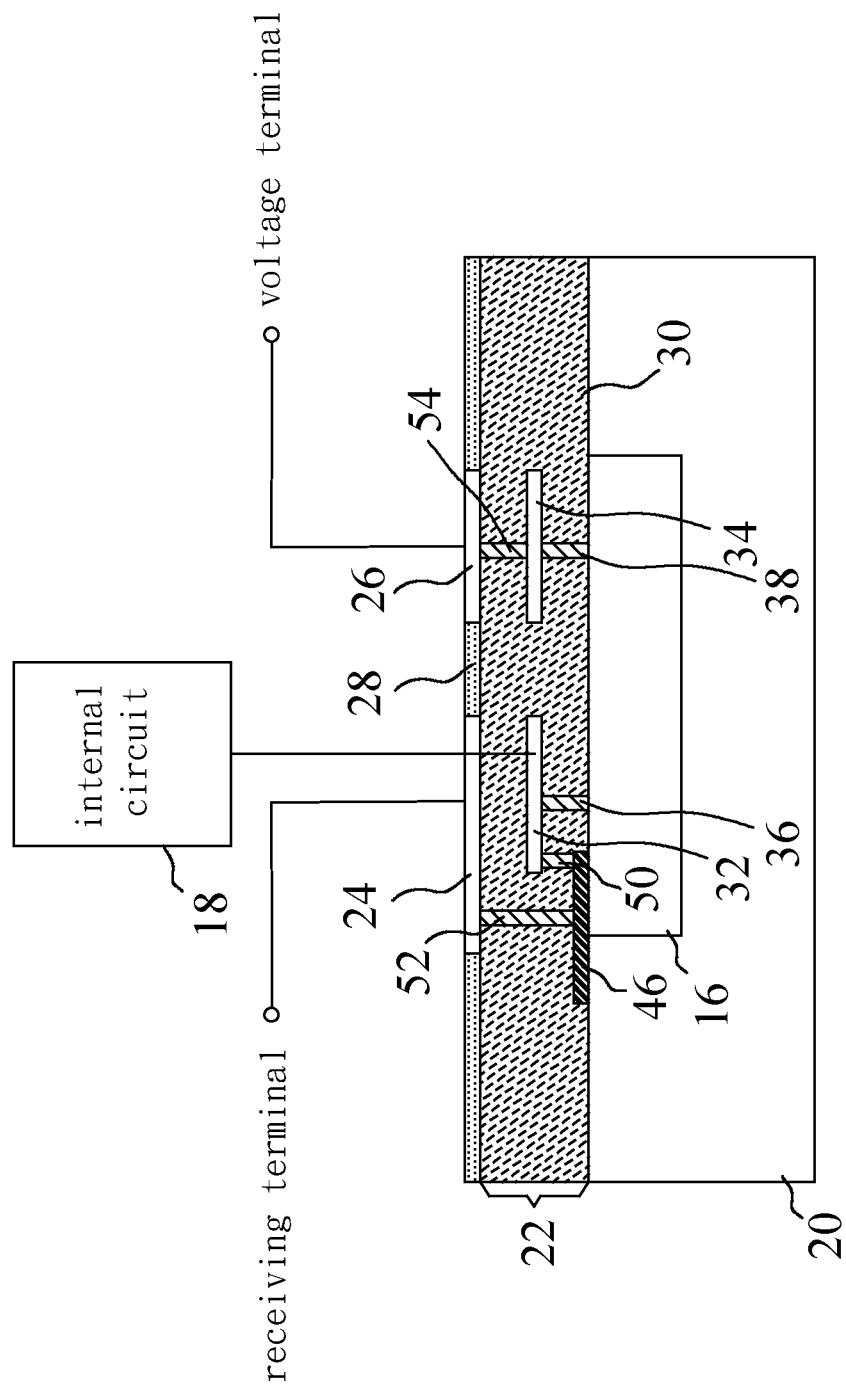
FIG. 5 is a cross-sectional view of a surge protector, a first electrostatic discharge (ESD) protector, and a first electrostatic discharge (ESD) enhancer realized with a resistive block according to the second embodiment of the present invention.

Refer to FIG. 5. In the second embodiment, the first ESD protector 16 is formed in a semiconductor substrate 20, a conductive wiring layer 22 is formed on the semiconductor substrate 20 and electrically connected to the first ESD protector 16. The conductive-tip discharging device used as the surge protector 14 further comprises at least one first conductive block 24 and at least one second conductive block 26, the at least one first conductive block 24 separates from the at least one second conductive block 26, the at least one first conductive block 24 and the at least one second conductive block 26 are formed on and electrically connected to the conductive wiring layer 22, a dielectric structure 28 is formed on the conductive wiring layer 22 and between the at least one first conductive block 24 and the at least one second conductive block 26, and the at least one first conductive block 24 and the at least one second conductive block 26 are respectively electrically connected to the receiving terminal and the voltage terminal. The resistive block 46 is formed between the conductive wiring layer 22 and the semiconductor substrate 20. The conductive wiring layer 22 further comprises a dielectric layer 30, at least one third conductive block 32, at least one fourth conductive block 34, a first conductive via 36, a second conductive via 38, a third conductive via 50, a fourth conductive via 52, and a fifth conductive via 54. The dielectric layer 30 is formed on the semiconductor substrate 20 to cover the resistive block 46 and provided with the at least one first conductive block 24, the at least one second conductive block 26, and the dielectric structure 28 thereon. The at least one third conductive block 32 is embedded in the dielectric layer 30 and electrically connected to the internal circuit 18. The at least one fourth conductive block 34 is embedded in the dielectric layer 30, separates from the at least one third conductive block 32, and electrically connected to the voltage terminal. The first conductive via 36 is formed in the dielectric layer 30 to electrically connect the first ESD protector 16 with the at least one third conductive block 32. The second conductive via 38 is formed in the dielectric layer 30 to electrically connect the first ESD protector 16 with the at least one fourth conductive block 34. The third conductive via 50 is formed in the dielectric layer 30 to electrically connect the at least one third conductive block 32 with the resistive block 46. The fourth conductive via 52 is formed in the dielectric layer 30 to electrically connect the resistive block 46 with the at least one first conductive block 24, and the at least one first conductive block 24 is electrically connected to the receiving terminal. The fifth conductive via 54 is formed in the dielectric layer 30 to electrically connect the at least one fourth conductive block 34 with the at least one second conductive block 26.

Figure 6:
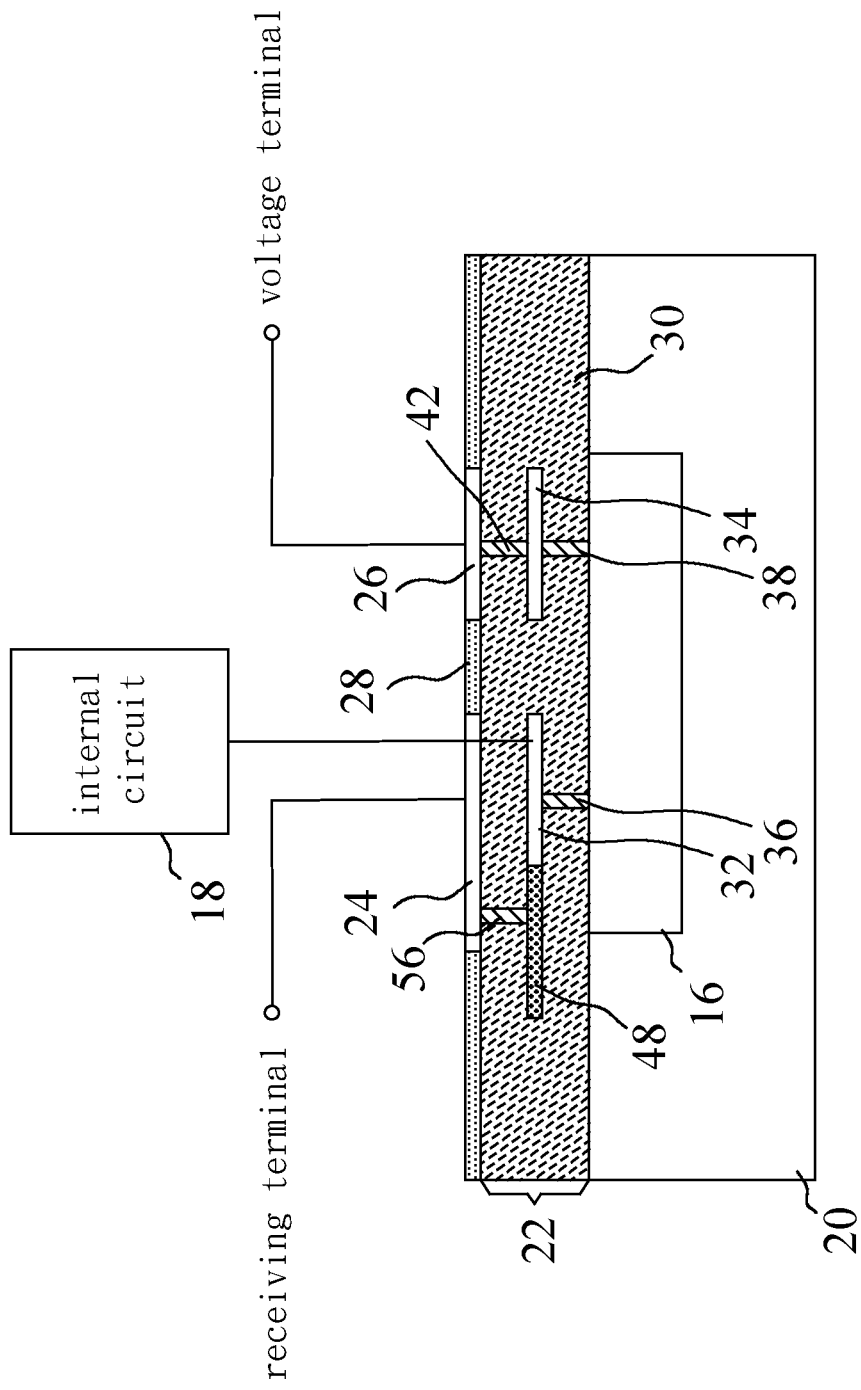
FIG. 6 is a cross-sectional view of a surge protector, a first ESD protector, and a first ESD enhancer realized with an inductive block according to the second embodiment of the present invention.

Refer to FIG. 6. In the second embodiment, the first ESD protector 16 is formed in a semiconductor substrate 20, a conductive wiring layer 22 is formed on the semiconductor substrate 20 and electrically connected to the first ESD protector 16. The conductive-tip discharging device used as the surge protector 14 further comprises at least one first conductive block 24 and at least one second conductive block 26, the at least one first conductive block 24 separates from the at least one second conductive block 26, the at least one first conductive block 24 and the at least one second conductive block 26 are formed on and electrically connected to the conductive wiring layer 22, a dielectric structure 28 is formed on the conductive wiring layer 22 and between the at least one first conductive block 24 and the at least one second conductive block 26, and the at least one first conductive block 24 and the at least one second conductive block 26 are respectively electrically connected to the receiving terminal and the voltage terminal. The inductive block 48 is embedded in the conductive wiring layer 22. The conductive wiring layer 22 further comprises a dielectric layer 30, at least one third conductive block 32, at least one fourth conductive block 34, a first conductive via 36, a second conductive via 38, a third conductive via 56, and a fourth conductive via 42. The dielectric layer 30 is formed on the semiconductor substrate 20 and provided with the at least one first conductive block 24, the at least one second conductive block 26, and the dielectric structure 28 thereon, and the inductive block 48 is embedded in the dielectric layer. The at least one third conductive block 32 is embedded in the dielectric layer 30 and electrically connected to the inductive block 48 and the internal circuit 18. The at least one fourth conductive block 34 is embedded in the dielectric layer 30, separates from the at least one third conductive block 32, and electrically connected to the voltage terminal. The first conductive via 36 is formed in the dielectric layer 30 to electrically connect the first ESD protector 16 with the at least one third conductive block 32. The second conductive via 38 is formed in the dielectric layer 30 to electrically connect the first ESD protector 16 with the at least one fourth conductive block 34. The third conductive via 56 is formed in the dielectric layer 30 to electrically connect the inductive block 48 with the at least one first conductive block 24, and the at least one first conductive block 24 is electrically connected to the receiving terminal. The fourth conductive via 42 is formed in the dielectric layer 30 to electrically connect the at least one fourth conductive block 34 with the at least one second conductive block 26.

Figure 7:
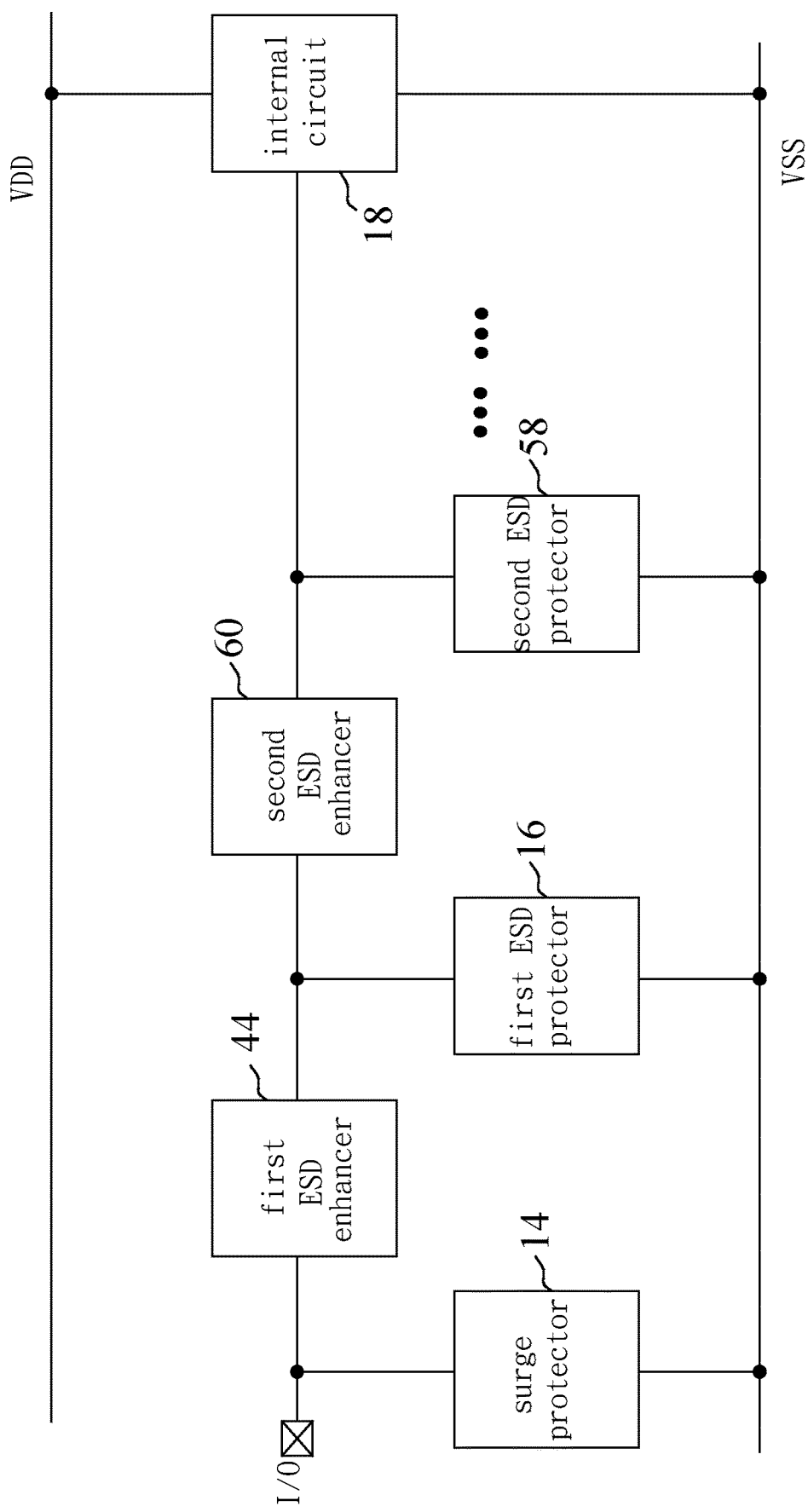
FIG. 7 is a schematic diagram illustrating an on-chip multiple-stage EOS protection device according to the third embodiment of the present invention.

Refer to FIG. 7. The third embodiment of the on-chip multiple-stage EOS protection device of the present invention is introduced as follows. The third embodiment is different from the second embodiment in that the third embodiment further comprises a plurality of second electrostatic discharge (ESD) protectors 58 having different third clamping voltages lower than the second clamping voltage and a plurality of second electrostatic discharge (ESD) enhancers 60. The plurality of second ESD protectors 58 are electrically connected in parallel and electrically connected between the internal circuit 18 and the voltage terminal. The plurality of second ESD enhancers 60 are electrically connected between the first ESD enhancer 44 and the internal circuit 18 to block the surge signal, one of the plurality of second ESD enhancers 60 is electrically connected between two of the plurality of second ESD protectors 58, and one of the plurality of second ESD enhancers 60 is electrically connected between the first ESD enhancer 44 and one of the plurality of second ESD enhancers 60. The surge protector 14 and the first ESD protector 16, the plurality of second ESD protectors 58, the first ESD enhancer 44, and the plurality of second ESD enhancers 60 are integrated in a chip that is independent from the internal circuit 18.

When the EOS signal appears at the receiving terminal, the plurality of second ESD protectors 58 are sequentially triggered on according to an order of from the lowest third clamping voltage to the highest third clamping voltage by voltage drops of the plurality of second ESD protectors 58. After the plurality of second ESD protectors 58 are triggered on, the first ESD protector 16 and the surge protector 14 are triggered on in turn by the voltage drop of the first ESD enhancer 44.

Each of the plurality of second ESD protectors 58 is a diode, a diode-string, a Zener diode, a Zener diode-string, a metal-oxide-semiconductor field effect transistor (MOSFET), a cascaded metal-oxide-semiconductor field effect transistor (MOSFET)-string, a bipolar junction transistor (BJT), or a cascoded bipolar junction transistor (BJT)-string. Each of the plurality of second ESD enhancer 60 is a forward diode, a diode-string, a resistor, a resistor-string, an inductor, an inductor-string, a capacitor, a capacitor-string, a single-stage resistor-capacitor (RC) network shunted to ground, a single-stage inductor-capacitor (LC) network shunted to ground, a multiple-stage resistor-capacitor (RC) network shunted to ground, or a multiple-stage inductor-capacitor (LC) network shunted to ground.

Figure 8:
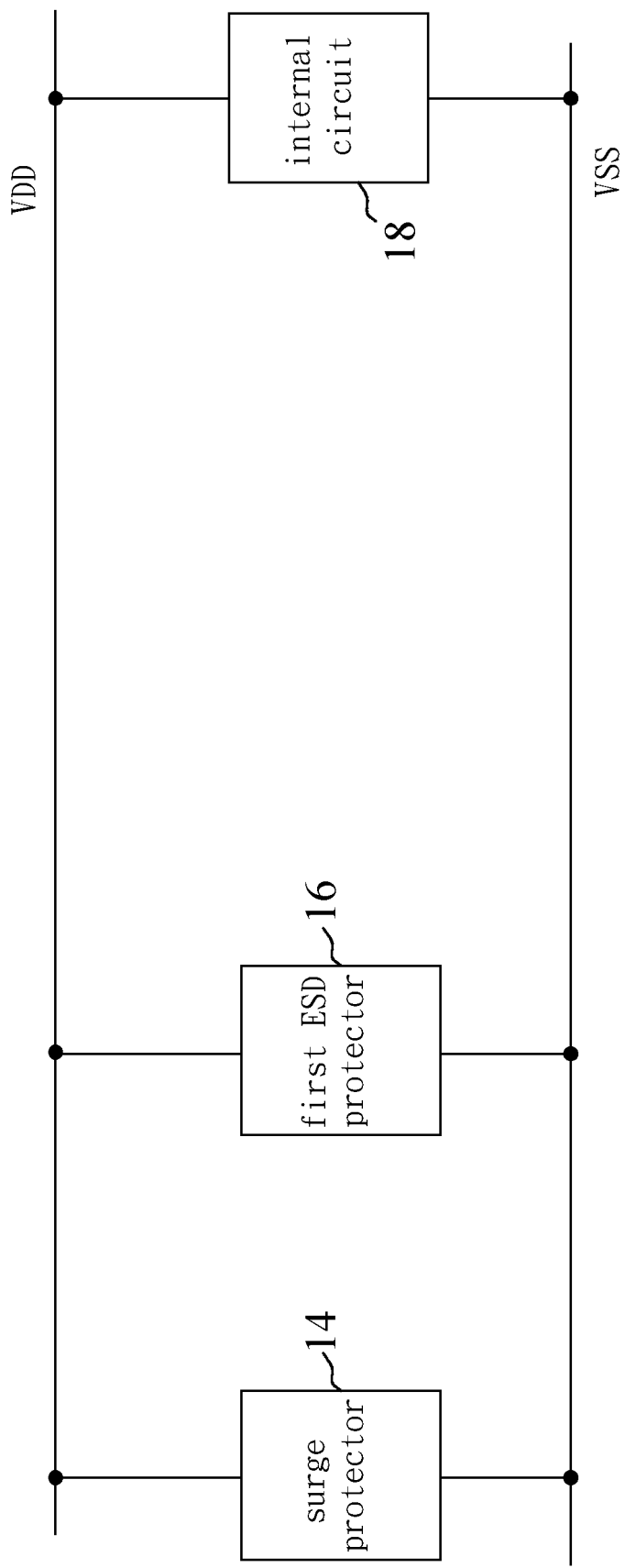
FIG. 8 is a schematic diagram illustrating an on-chip multiple-stage EOS protection device according to the fourth embodiment of the present invention.

Refer to FIG. 8. The fourth embodiment of the on-chip multiple-stage EOS protection device of the present invention is introduced as follows. The fourth embodiment is different from the first embodiment in that the fourth embodiment uses the receiving terminal as a high-voltage terminal VDD to replace the I/O port.

Figure 9:
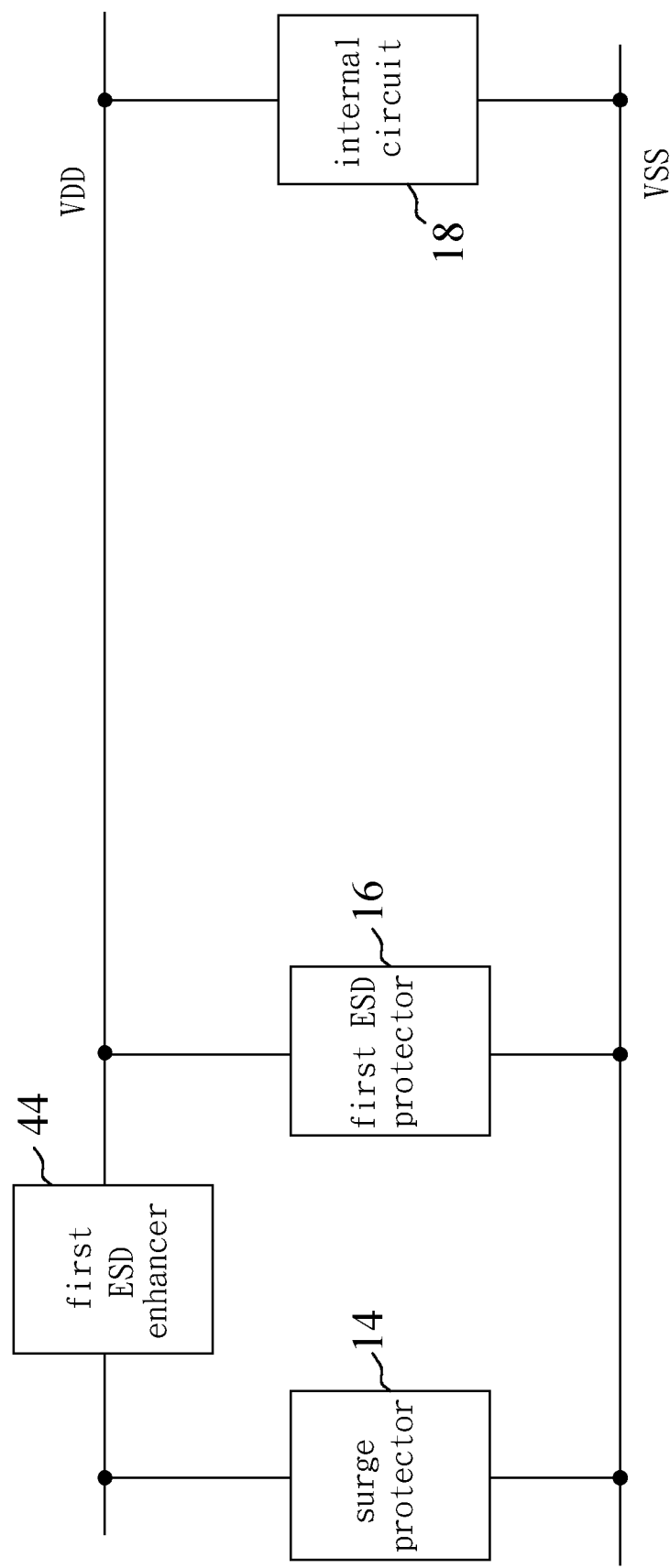
FIG. 9 is a schematic diagram illustrating an on-chip multiple-stage EOS protection device according to the fifth embodiment of the present invention.

Refer to FIG. 9. The fifth embodiment of the on-chip multiple-stage EOS protection device of the present invention is introduced as follows. The fifth embodiment is different from the second embodiment in that the fifth embodiment uses the receiving terminal as a high-voltage terminal VDD to replace the I/O port.

Figure 10:
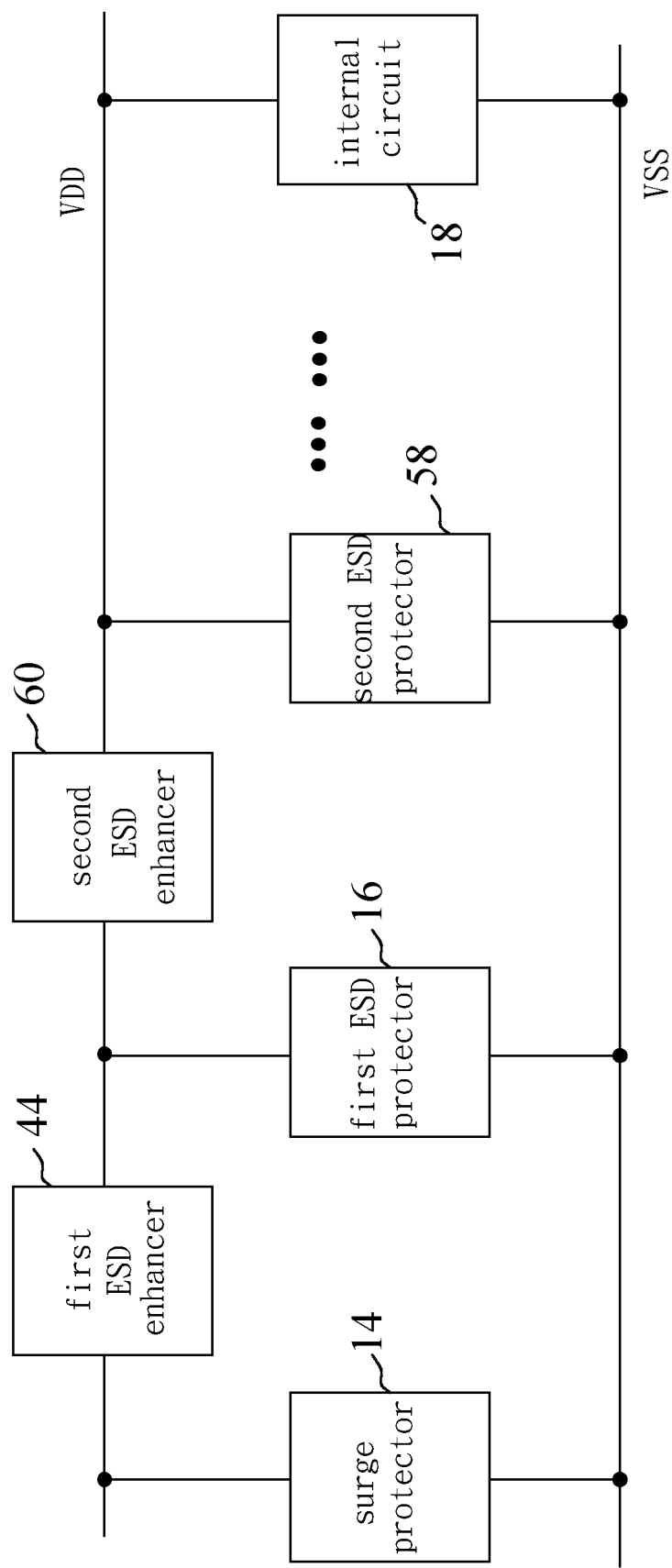
FIG. 10 is a schematic diagram illustrating an on-chip multiple-stage EOS protection device according to the sixth embodiment of the present invention.

Refer to FIG. 10. The sixth embodiment of the on-chip multiple-stage EOS protection device of the present invention is introduced as follows. The sixth embodiment is different from the third embodiment in that the sixth embodiment uses the receiving terminal as a high-voltage terminal VDD to replace the I/O port.

Figure 11:
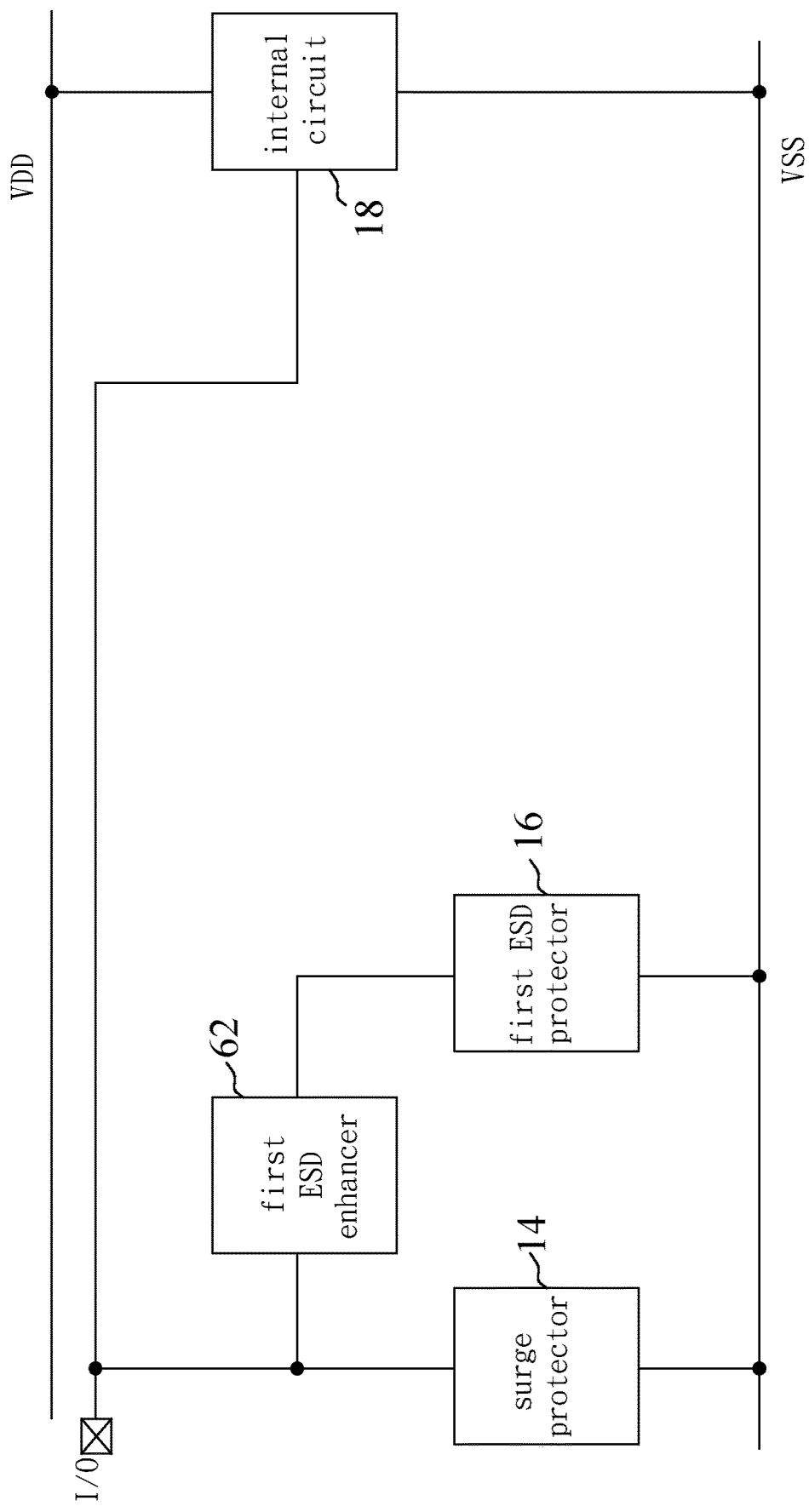
FIG. 11 is a schematic diagram illustrating an on-chip multiple-stage EOS protection device according to the seventh embodiment of the present invention.

Refer to FIG. 11. The seventh embodiment of the on-chip multiple-stage EOS protection device of the present invention is introduced as follows. The seventh embodiment is different from the first embodiment in that the seventh embodiment further comprises a first electrostatic discharge (ESD) enhancer 62 electrically connected between the receiving terminal and the first ESD protector 16. The surge protector 14, the first ESD protector 16, and the first ESD enhancer 62 are integrated in a chip that is independent from the internal circuit 18. When the EOS signal appears at the receiving terminal, the first ESD protector 16 and the surge protector 14 are triggered on in turn by the voltage drop of the first ESD enhancer 62.

The first ESD enhancer 62 may be a forward diode, a diode-string, a resistor, a resistor-string, an inductor, an inductor-string, a capacitor, a capacitor-string, a single-stage resistor-capacitor (RC) network shunted to ground, a single-stage inductor-capacitor (LC) network shunted to ground, a multiple-stage resistor-capacitor (RC) network shunted to ground, or a multiple-stage inductor-capacitor (LC) network shunted to ground.

Figure 12:
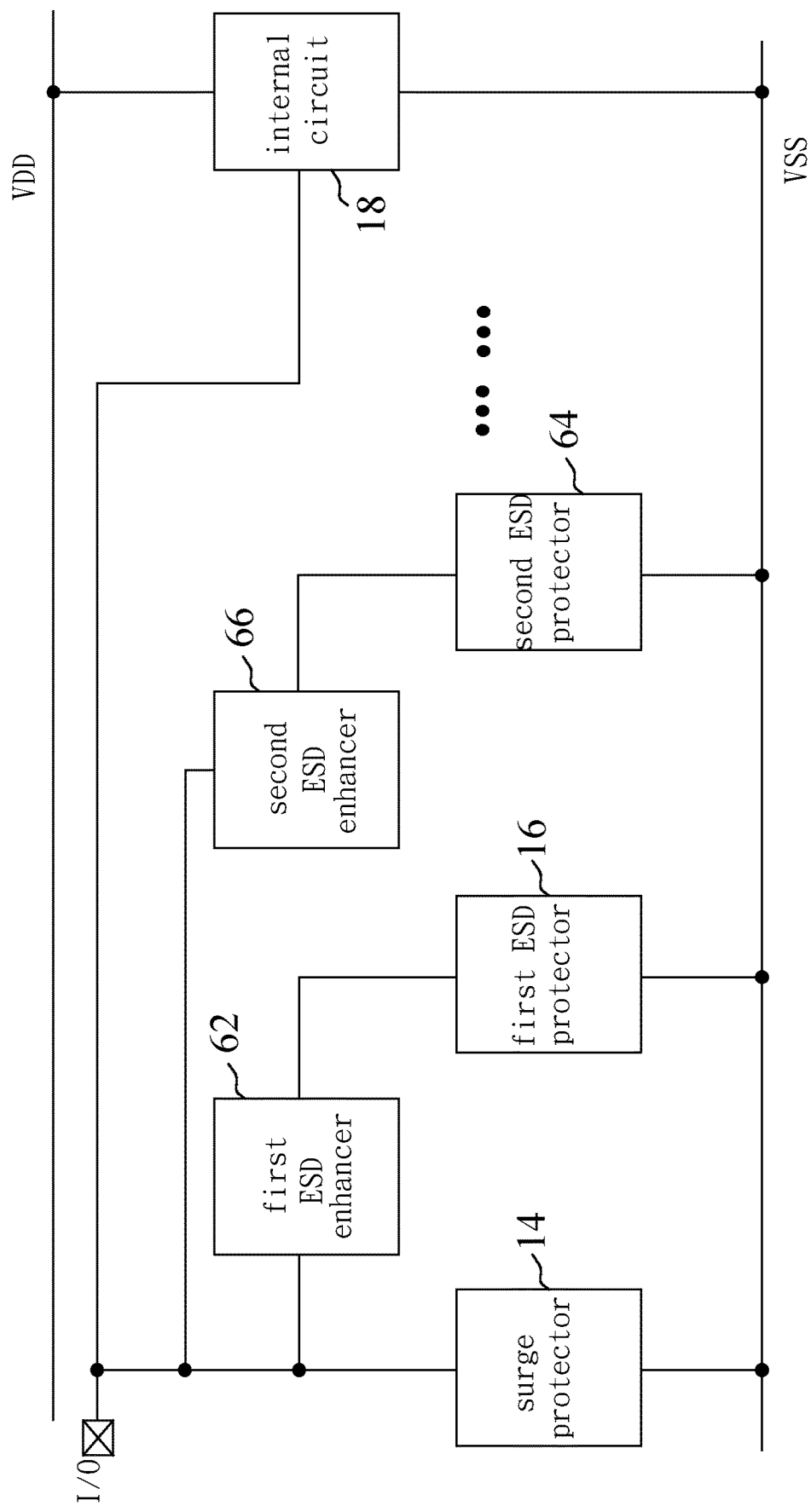
FIG. 12 is a schematic diagram illustrating an on-chip multiple-stage EOS protection device according to the eighth embodiment of the present invention.

Refer to FIG. 12. The eighth embodiment of the on-chip multiple-stage EOS protection device of the present invention is introduced as follows. The eighth embodiment is different from the seventh embodiment in that the eighth embodiment further comprises a plurality of second electrostatic discharge (ESD) protectors 64 having different third clamping voltages lower than the second clamping voltage and a plurality of second electrostatic discharge (ESD) enhancers 66. The plurality of second ESD protectors 64 are electrically connected in parallel and electrically connected between the internal circuit 18 and the voltage terminal. The plurality of second ESD enhancers 66 are respectively electrically connected to the plurality of second ESD protectors 64, and each of the plurality of second ESD enhancers 66 is electrically connected between the second ESD protector 64 corresponded thereof and the internal circuit 18. The surge protector 14 and the first ESD protector 16, the plurality of second ESD protectors 58, the first ESD enhancer 62, and the plurality of second ESD enhancers 60 are integrated in a chip that is independent from the internal circuit 18.

When the EOS signal appears at the receiving terminal, the plurality of second ESD protectors 64 are sequentially triggered on according to an order of from the lowest third clamping voltage to the highest third clamping voltage by voltage drops of the plurality of second ESD enhancers 66. After the plurality of second ESD protectors 64 are triggered on, the first ESD protector 16 and the surge protector 14 are triggered on in turn by the voltage drop of the first ESD enhancer 62.

Figure 13:
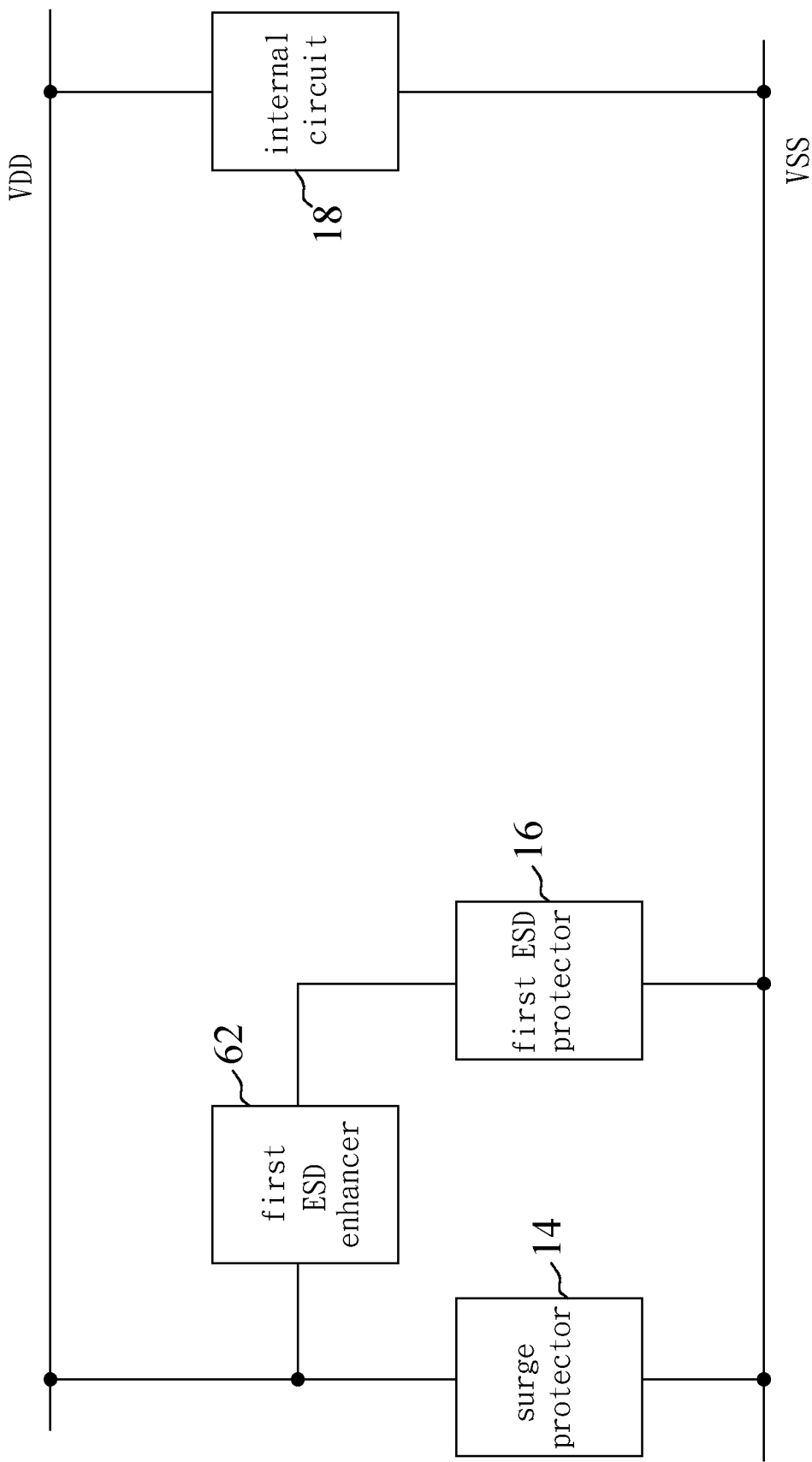
FIG. 13 is a schematic diagram illustrating an on-chip multiple-stage EOS protection device according to the ninth embodiment of the present invention.

Refer to FIG. 13. The ninth embodiment of the on-chip multiple-stage EOS protection device of the present invention is introduced as follows. The ninth embodiment is different from the seventh embodiment in that the ninth embodiment uses the receiving terminal as a high-voltage terminal VDD to replace the I/O port.

Figure 14:
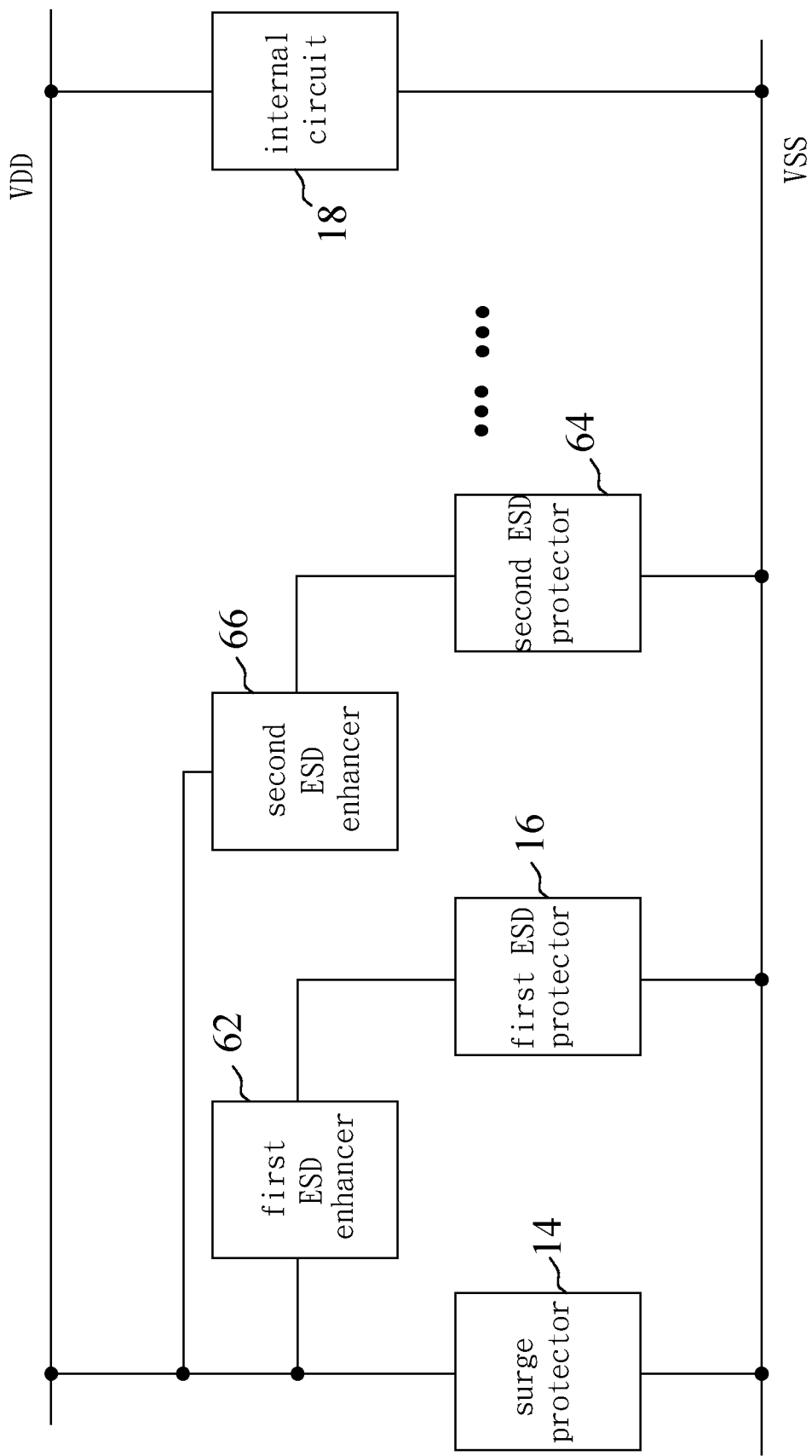
FIG. 14 is a schematic diagram illustrating an on-chip multiple-stage EOS protection device according to the tenth embodiment of the present invention.

Refer to FIG. 14. The tenth embodiment of the on-chip multiple-stage EOS protection device of the present invention is introduced as follows. The tenth embodiment is different from the eighth embodiment in that the tenth embodiment uses the receiving terminal as a high-voltage terminal VDD to replace the I/O port.

In conclusion, the present invention installs the surge protector and the ESD protectors in a chip to successfully prevent the internal circuit from damage of a surge event or an ESD event.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An on-chip multiple-stage electrical overstress (EOS) protection device comprising:
   a surge protector having a first clamping voltage; and
   a first electrostatic discharge (ESD) protector having a second clamping voltage lower than the first clamping voltage, the surge protector is electrically connected to the first ESD protector in parallel, the surge protector and the first ESD protector are electrically connected between a receiving terminal and a voltage terminal, the receiving terminal is electrically connected to an internal circuit, and when an electrical overstress (EOS) signal comprising an electrostatic discharge (ESD) signal and a surge signal appears at the receiving terminal, the first ESD protector and the surge protector are triggered on in turn to clamp a voltage received by the internal circuit, said surge protector being a conductive-tip discharging device, wherein the first ESD protector is formed in a semiconductor substrate, a conductive wiring layer is formed on the semiconductor substrate and electrically connected to the first ESD protector, the conductive-tip discharging device further comprises at least one first conductive block and at least one second conductive block, the at least one first conductive block separates from the at least one second conductive block, the at least one first conductive block and the at least one second conductive block are formed on and electrically connected to the conductive wiring layer, a dielectric structure is formed on the conductive wiring layer and between the at least one first conductive block and the at least one second conductive block, the at least one first conductive block and the at least one second conductive block are respectively electrically connected to the receiving terminal and the voltage terminal, and the at least one first conductive block is electrically connected to the internal circuit.

2. The on-chip multiple-stage EOS protection device according to claim 1, wherein the receiving terminal is an input/output (I/O) port, the voltage terminal is a low-voltage terminal, and the internal circuit is electrically connected to the low-voltage terminal and a high-voltage terminal.

3. The on-chip multiple-stage EOS protection device according to claim 1, wherein the receiving terminal is a high-voltage terminal and the voltage terminal is a low-voltage terminal, and the internal circuit is electrically connected to the low-voltage terminal.

4. The on-chip multiple-stage EOS protection device according to claim 1, further comprising a first electrostatic discharge (ESD) enhancer electrically connected between the surge protector and the first ESD protector and electrically connected between the receiving terminal and the internal circuit to block the surge signal, and when the EOS signal appears at the receiving terminal, the first ESD protector and the surge protector are triggered on in turn by a voltage drop of the first ESD enhancer.

5. The on-chip multiple-stage EOS protection device according to claim 4, wherein the first ESD enhancer is a resistive block formed between the conductive wiring layer and the semiconductor substrate, and the conductive wiring layer further comprises:
   a dielectric layer formed on the semiconductor substrate to cover the resistive block and provided with the at least one first conductive block, the at least one second conductive block, and the dielectric structure thereon;
   at least one third conductive block embedded in the dielectric layer and electrically connected to the internal circuit;
   at least one fourth conductive block embedded in the dielectric layer, separating from the at least one third conductive block, and electrically connected to the voltage terminal;
   a first conductive via formed in the dielectric layer to electrically connect the first ESD protector with the at least one third conductive block;
   a second conductive via formed in the dielectric layer to electrically connect the first ESD protector with the at least one fourth conductive block;
   a third conductive via formed in the dielectric layer to electrically connect the at least one third conductive block with the resistive block;
   a fourth conductive via formed in the dielectric layer to electrically connect the resistive block with the at least one first conductive block, and the at least one first conductive block is electrically connected to the receiving terminal; and
   a fifth conductive via formed in the dielectric layer to electrically connect the at least one fourth conductive block with the at least one second conductive block.

6. The on-chip multiple-stage EOS protection device according to claim 5, wherein the resistive block comprises high resistive polysilicon.

7. The on-chip multiple-stage EOS protection device according to claim 4, wherein the first ESD enhancer is an inductive block embedded in the conductive wiring layer, and the conductive wiring layer further comprises:
   a dielectric layer formed on the semiconductor substrate and provided with the at least one first conductive block, the at least one second conductive block, and the dielectric structure thereon, and the inductive block is embedded in the dielectric layer;

at least one third conductive block embedded in the dielectric layer and electrically connected to the inductive block and the internal circuit;

at least one fourth conductive block embedded in the dielectric layer, separating from the at least one third conductive block, and electrically connected to the voltage terminal;

a first conductive via formed in the dielectric layer to electrically connect the first ESD protector with the at least one third conductive block;

a second conductive via formed in the dielectric layer to electrically connect the first ESD protector with the at least one fourth conductive block;

a third conductive via formed in the dielectric layer to electrically connect the inductive block with the at least one first conductive block, and the at least one first conductive block is electrically connected to the receiving terminal; and a fourth conductive via formed in the dielectric layer to electrically connect the at least one fourth conductive block with the at least one second conductive block.

8. The on-chip multiple-stage EOS protection device according to claim 7, wherein the inductive block is an inductive coil.

9. The on-chip multiple-stage EOS protection device according to claim 1, further comprising a first electrostatic discharge (ESD) enhancer electrically connected between the surge protector and the first ESD protector and electrically connected between the receiving terminal and the internal circuit to block the surge signal, and when the EOS signal appears at the receiving terminal, the first ESD protector and the surge protector are triggered on in turn by a voltage drop of the first ESD enhancer.

10. The on-chip multiple-stage EOS protection device according to claim 9, further comprising:

a plurality of second electrostatic discharge (ESD) protectors having different third clamping voltages lower than the second clamping voltage, electrically connected in parallel, and electrically connected between the internal circuit and the voltage terminal; and a plurality of second electrostatic discharge (ESD) enhancers electrically connected between the first ESD enhancer and the internal circuit to block the surge signal, one of the plurality of second ESD enhancers is electrically connected between two of the plurality of second ESD protectors, one of the plurality of second ESD enhancers is electrically connected between the first ESD enhancer and one of the plurality of second ESD enhancers, when the EOS signal appears at the receiving terminal, the plurality of second ESD protectors are sequentially triggered on according to an order of from a lowest the third clamping voltage to a highest the third clamping voltage by voltage drops of the plurality of second ESD enhancers, and after the plurality of second ESD protectors are triggered on, the first ESD protector is triggered on.

11. The on-chip multiple-stage EOS protection device according to claim 10, wherein the surge protector and the first ESD protector, the plurality of second ESD protectors, the first ESD enhancer, and the plurality of second ESD enhancers are integrated in a chip.

12. The on-chip multiple-stage EOS protection device according to claim 10, wherein the first ESD enhancer is a forward diode, a diode-string, a resistor, a resistor-string, an inductor, an inductor-string, a capacitor, a capacitor-string, a single-stage resistor-capacitor (RC) network shunted to ground, a single-stage inductor-capacitor (LC) network shunted to ground, a multiple-stage resistor-capacitor (RC) network shunted to ground, or a multiple-stage inductor-capacitor (LC) network shunted to ground, and each of the plurality of second ESD enhancer is a forward diode, a diode-string, a resistor, a resistor-string, an inductor, an inductor-string, a capacitor, a capacitor-string, a single-stage resistor-capacitor (RC) network shunted to ground, a single-stage inductor-capacitor (LC) network shunted to ground, a multiple-stage resistor-capacitor (RC) network shunted to ground, or a multiple-stage inductor-capacitor (LC) network shunted to ground.

13. The on-chip multiple-stage EOS protection device according to claim 10, wherein each of the plurality of second ESD protectors is a diode, a diode-string, a Zener diode, a Zener diode-string, a metal-oxide-semiconductor field effect transistor (MOSFET), a cascaded metal-oxide-semiconductor field effect transistor (MOSFET)-string, a bipolar junction transistor (BJT), or a cascoded bipolar junction transistor (BJT)-string.

14. The on-chip multiple-stage EOS protection device according to claim 1, further comprising a first electrostatic discharge (ESD) enhancer electrically connected between the receiving terminal and the first ESD protector, and when the EOS signal appears at the receiving terminal, the first ESD protector and the surge protector are triggered on in turn by a voltage drop of the first ESD enhancer.

15. The on-chip multiple-stage EOS protection device according to claim 14, further comprising:

a plurality of second electrostatic discharge (ESD) protectors having different third clamping voltages lower than the second clamping voltage, electrically connected in parallel, and electrically connected between the internal circuit and the voltage terminal; and a plurality of second electrostatic discharge (ESD) enhancers respectively electrically connected to the plurality of second ESD protectors, each of the plurality of second ESD enhancers is electrically connected between the second ESD protector corresponded thereof and the internal circuit, when the EOS signal appears at the receiving terminal, the plurality of second ESD protectors are sequentially triggered on according to an order of from a lowest the third clamping voltage to a highest the third clamping voltage by voltage drops of the plurality of second ESD enhancers, and after the plurality of second ESD protectors are triggered on, the first ESD protector is triggered on.

16. The on-chip multiple-stage EOS protection device according to claim 15, wherein the surge protector and the first ESD protector, the plurality of second ESD protectors, the first ESD enhancer, and the plurality of second ESD enhancers are integrated in a chip.

17. The on-chip multiple-stage EOS protection device according to claim 15, wherein the first ESD enhancer is a forward diode, a diode-string, a resistor, a resistor-string, an inductor, an inductor-string, a capacitor, a capacitor-string, a single-stage resistor-capacitor (RC) network shunted to ground, a single-stage inductor-capacitor (LC) network shunted to ground, a multiple-stage resistor-capacitor (RC) network shunted to ground, or a multiple-stage inductor-capacitor (LC) network shunted to ground, and each of the plurality of second ESD enhancer is a forward diode, a diode-string, a resistor, a resistor-string, an inductor, an inductor-string, a capacitor, a capacitor-string, a single-stage resistor-capacitor (RC) network shunted to ground, a single-stage inductor-capacitor (LC) network shunted to ground, a multiple-stage resistor-capacitor (RC) network shunted to ground, or a multiple-stage inductor-capacitor (LC) network shunted to ground.

18. The on-chip multiple-stage EOS protection device according to claim 15, wherein each of the plurality of second ESD protectors is a diode, a diode-string, a Zener diode, a Zener diode-string, a metal-oxide-semiconductor field effect transistor (MOSFET), a cascaded metal-oxide-semiconductor field effect transistor (MOSFET)-string, a bipolar junction transistor (BJT), or a cascoded bipolar junction transistor (BJT)-string.

19. The on-chip multiple-stage EOS protection device according to claim 1, wherein the surge protector is a conductive-tip discharging device, a silicon-controlled rectifier (SCR), a cascoded SCR-string, a transient voltage suppressor (TVS), a cascoded transient voltage suppressor (TVS)-string, a metal-oxide-semiconductor field effect transistor (MOSFET), a cascoded metal-oxide-semiconductor field effect transistor (MOSFET)-string, a bipolar junction transistor (BJT), a cascoded bipolar junction transistor (BJT) string, a varistor, a cascoded varistor-string, a diode, a diode-string, a Zener diode, or a Zener diode-string.

20. The on-chip multiple-stage EOS protection device according to claim 1, wherein the first ESD protector is a silicon-controlled rectifier (SCR), a cascoded silicon-controlled rectifier (SCR)-string, a transient voltage suppressor (TVS), a cascoded transient voltage suppressor (TVS)-string, a metal-oxide-semiconductor field effect transistor (MOSFET), a cascoded metal-oxide-semiconductor field effect transistor (MOSFET)-string, a bipolar junction transistor (BJT), a cascoded bipolar junction transistor (BJT) string, a varistor, a cascoded varistor-string, a diode, a diode-string, a Zener diode, or a Zener diode-string.

* * * * *